(12) United States Patent
Chen et al.

(10) Patent No.: US 8,278,125 B2
(45) Date of Patent: Oct. 2, 2012

(54) GROUP-III NITRIDE EPITAXIAL LAYER ON SILICON SUBSTRATE

(75) Inventors: Ding-Yuan Chen, Taichung (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/225,164

(22) Filed: Sep. 2, 2011

(65) Prior Publication Data

US 2011/0318860 A1 Dec. 29, 2011

Related U.S. Application Data

(63) Continuation of application No. 12/127,607, filed on May 27, 2008, now Pat. No. 8,030,666.

(60) Provisional application No. 61/045,504, filed on Apr. 16, 2008.

(51) Int. Cl.
*H01L 21/00* (2006.01)

(52) U.S. Cl. ................ 438/22; 438/46; 257/79

(58) Field of Classification Search .................. None
See application file for complete search history.

(56) References Cited

U.S. PATENT DOCUMENTS

| | | | |
|---|---|---|---|
| 6,069,021 A | 5/2000 | Terashima et al. | |
| 6,940,098 B1 | 9/2005 | Tadatomo et al. | |
| 6,967,355 B2 | 11/2005 | Kryliouk et al. | |
| 7,053,420 B2 * | 5/2006 | Tadatomo et al. | ............... 257/98 |
| 7,664,151 B2 | 2/2010 | Ueda et al. | |
| 2002/0069816 A1 | 6/2002 | Gehrke et al. | |

OTHER PUBLICATIONS

Lee, S.C., et al., "Nanoscale Spatial Phase Modulation of GaN on a V-Grooved Si Substrate—Cubic Phase GaN on Si(001) for Monolithic Integration," IEEE Journal of Quantum Electronics, vol. 41, No. 4, Apr. 2005, pp. 596-605.

* cited by examiner

*Primary Examiner* — Thien F Tran
(74) *Attorney, Agent, or Firm* — Slater & Matsil, L.L.P.

(57) ABSTRACT

A semiconductor device includes a silicon substrate; silicon faceted structures formed on a top surface of the silicon substrate; and a group-III nitride layer over the silicon faceted structures. The silicon faceted structures are separated from each other, and have a repeated pattern.

20 Claims, 8 Drawing Sheets

GROUP-III NITRIDE EPITAXIAL LAYER ON SILICON SUBSTRATE

This application is a continuation of U.S. patent application Ser. No. 12/127,607, filed on May 27, 2008, entitled "Group-III Nitride Epitaxial Layer on Silicon Substrate," which application further claims the benefit of the following provisionally filed U.S. Patent Application Ser. No. 61/045,504, filed Apr. 16, 2008, entitled "III-Nitride Epitaxial Layer on Patterned Silicon Substrate," which applications are hereby incorporated herein by reference.

TECHNICAL FIELD

This invention relates generally to semiconductor device manufacturing processes, and more particularly to forming crystalline group-III nitride films on silicon substrates.

BACKGROUND

Group-III nitride (often referred to as III-nitride or III-N) compounds, such as gallium nitride (GaN) and its related alloys, have been under intense research in recent years due to their promising applications in electronic and optoelectronic devices. Particular examples of potential optoelectronic devices include blue light emitting and laser diodes, and UV photo-detectors. The large bandgap and high electron saturation velocity of the III-nitride compounds also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material whose lattice constant and thermal expansion coefficient closely match that of GaN.

SiC is a semiconductor material providing excellent thermal conductivity, but is very expensive and available only in small wafer sizes. Direct growth of GaN on SiC is generally difficult due to poor wetting between these materials. Although buffer layers, such as AlN or AlGaN, can be used to address this wetting problem, such buffer layers cause an increase in the resistance between the overlying device and the underlying substrate. In addition, it is very difficult to prepare a SiC layer having a smooth surface, while a rough interface with GaN can cause an increase in defect density of the GaN layer.

The most highly refined semiconductor substrates are silicon substrates, which have also been considered for the growth of GaN films. Silicon substrates for GaN growth is attractive given its low cost, large diameter, high crystal and surface quality, controllable electrical conductivity, and high thermal conductivity. The use of silicon wafers promises easy integration of GaN-based optoelectronic devices with Si-based electronic devices.

Among the feasible substrates, silicon (100) substrate is well known in the art of CMOS circuits. However, silicon (100) has a great lattice mismatch with GaN. As a result, the GaN films grown on silicon (100) substrates have polycrystalline structures, instead of the desirable crystalline structures. On the other hand, silicon (111) substrates are more suitable for forming GaN films due to their trigonal symmetry. However, silicon (111) substrates are rarely used for conventional CMOS applications, and hence have relatively higher cost and less availability. The above discussed options require compromise to be made between cost, performance, and/or process complexity. New methods for forming GaN films are thus needed to solve the above discussed problems.

SUMMARY OF THE INVENTION

In accordance with one aspect of the present invention, a semiconductor device includes a silicon substrate; silicon pyramids formed on a top surface of the silicon substrate; and a group-III nitride layer over the silicon faceted structures. The silicon faceted structures are separated from each other and have a repeated pattern.

In accordance with another aspect of the present invention, a semiconductor device includes a silicon (100) substrate; and silicon faceted structures formed on a top surface of, and contacting, the silicon (100) substrate. The silicon faceted structures are arranged as an array. The slopes of the silicon faceted structures have (111) surface orientations. The semiconductor device further includes a gallium nitride layer over the silicon faceted structures, wherein the gallium nitride layer contacts the slopes of the silicon faceted structures; and a mask having a grid structure separating each of the silicon faceted structures from others, wherein the mask is between the gallium nitride layer and the silicon (100) substrate.

In accordance with yet another aspect of the present invention, a semiconductor device includes a silicon (100) substrate; and silicon faceted structures formed on, and contacting, a top surface of the silicon substrate. The silicon faceted structures are arranged as an array. The slopes of the silicon faceted structures have (111) surface orientations. The semiconductor device further includes a gallium nitride layer over the silicon faceted structures. The gallium nitride layer contacts the slopes of the silicon faceted structures. The gallium nitride layer has a crystalline structure. The semiconductor device further includes an additional layer over, and contacting, the gallium nitride layer. The gallium nitride layer and the additional layer are formed of different materials.

In accordance with yet another aspect of the present invention, a method of forming a semiconductor device includes providing a silicon substrate; epitaxially growing silicon faceted structures on a top surface of the silicon substrate; and forming a group-III nitride layer over the silicon faceted structures. The group-III nitride layer contacts slopes of the silicon faceted structures.

In accordance with yet another aspect of the present invention, a method of forming a semiconductor device includes providing a silicon (100) substrate; forming a mask having a grid pattern, wherein portions of a top surface of the silicon (100) substrate are exposed through the mask to form an array; epitaxially growing silicon faceted structures on the exposed portions of the top surface of the silicon (100) substrate, wherein slopes of the silicon faceted structures have (111) surface orientations; and growing a gallium nitride layer over the silicon faceted structures, wherein the gallium nitride layer contacts the slopes of the silicon faceted structures.

By using the embodiments of the present invention, group-III nitride layers can be formed over silicon (100) substrates, and hence making it possible to form optical devices on silicon (100) substrates.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming group-III nitride films and the resulting structures are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1A:
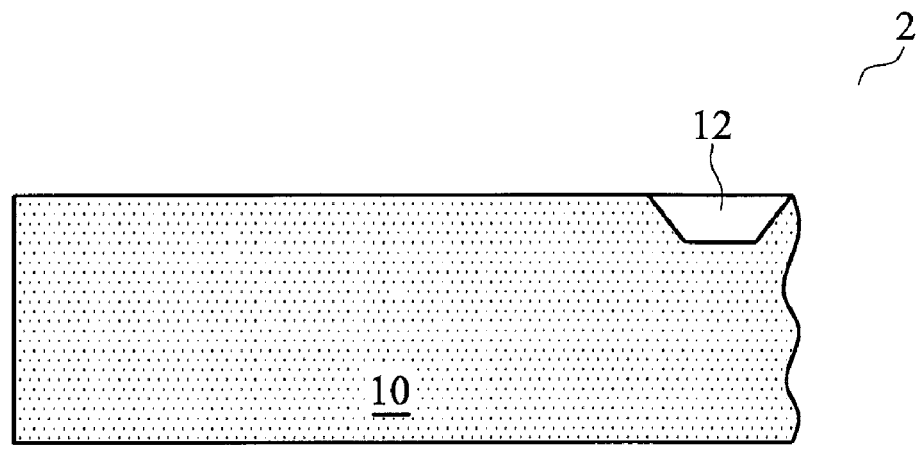
FIGS. 1A, 1B, 2A, 2B, 3A, 3B and 4 through 11 are cross-sectional views of intermediate stages in the manufacturing of embodiments of the present invention.
Figure 1B:
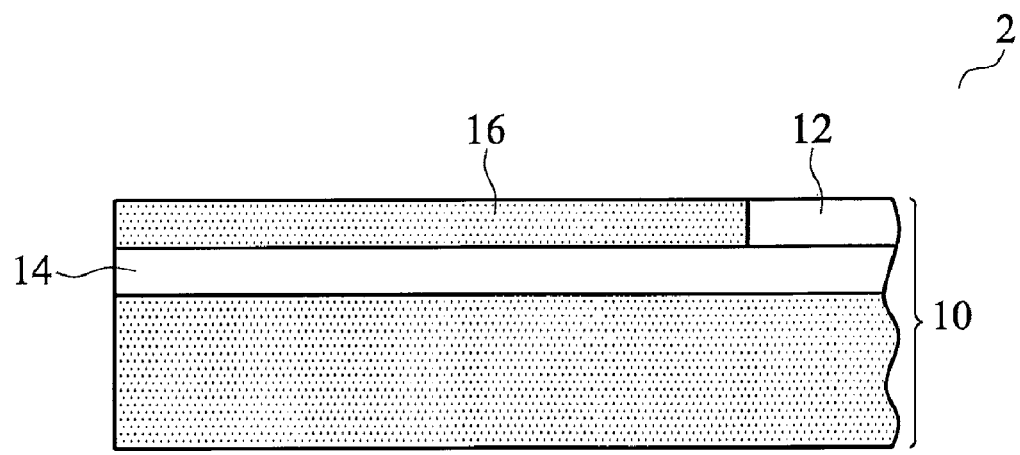

FIGS. 1A and 1B illustrate silicon substrate 10. In an embodiment, silicon substrate 10 is a (100) substrate having a (100) surface orientation, although it may have other surface orientations, such as (110). Silicon substrate 10 may be a bulk substrate, as is shown in FIG. 1A, or may be a silicon-on-insulator substrate having buried oxide 14 between silicon layers, as is shown in FIG. 1B. In the structure shown in FIG. 1B, the upper silicon layer 16 preferably has a (100) or a (110) surface orientation. In an embodiment, silicon substrate 10 is in semiconductor chip 2, which may further include isolation regions 12, in silicon substrate 10. Semiconductor chip 2 may be a portion of a wafer.

Figure 2A:
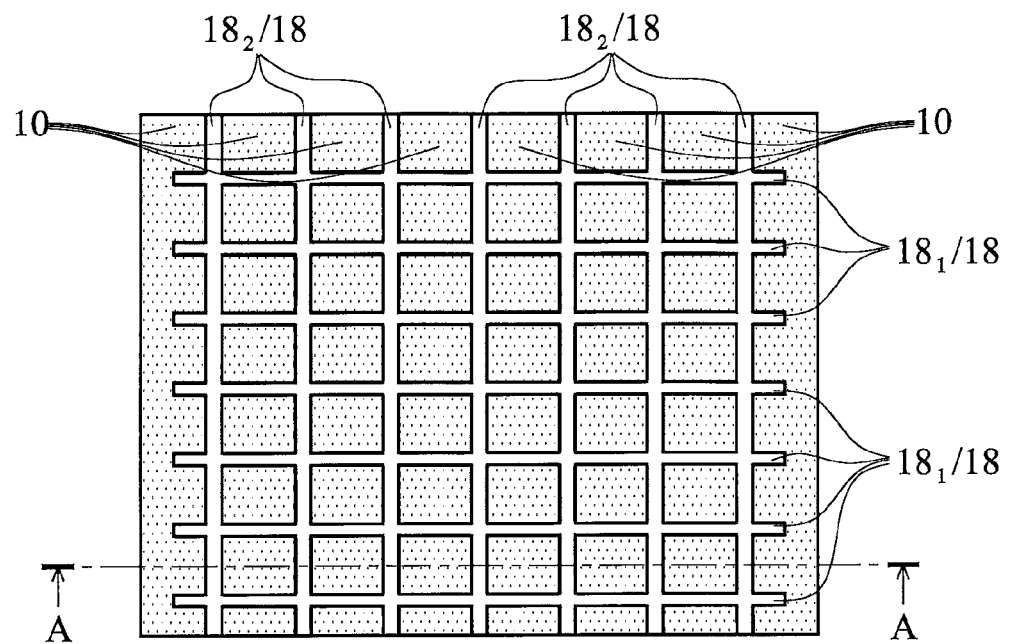
Figure 2B:
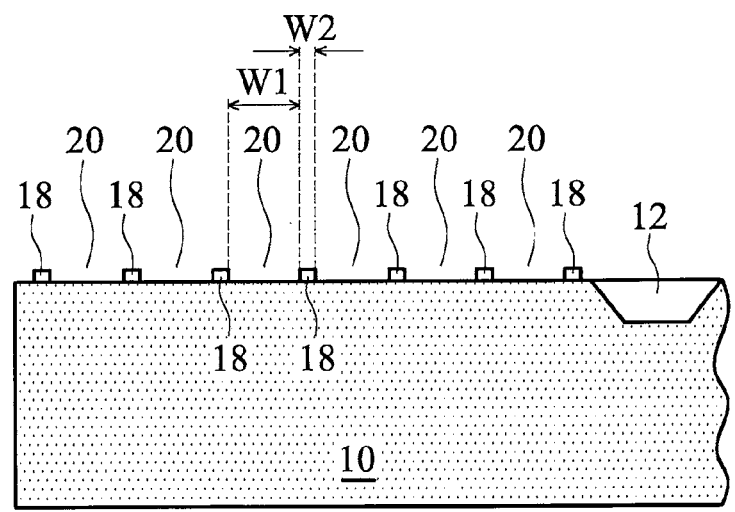
Figure 3A:
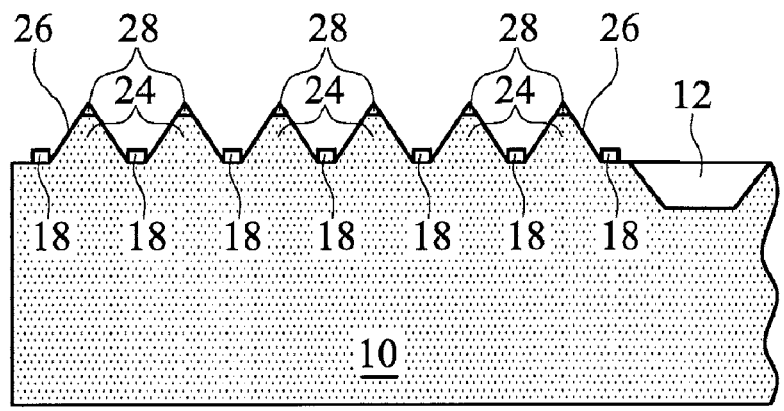

Referring to FIGS. 2A and 2B, mask 18 is formed on silicon substrate 10. FIG. 2A shows a top view, while FIG. 2B shows a cross-sectional view taken along a plane crossing line A-A' in FIG. 2A. Preferably, mask 18 is formed of a dielectric material, and is preferably not wettable to the subsequently formed silicon pyramids 24, as shown in FIG. 3A. In an embodiment, mask 18 is formed of silicon oxide, which may be a thermal oxide or deposited oxide. Alternatively, mask 18 is formed of other materials such as silicon nitride ($SiN_x$), silicon oxynitride (SiON), aluminum oxide ($AlO_x$), or the like. The formation of mask 18 may include blanket forming a mask layer and patterning the mask layer.

In the preferred embodiment, mask 18 is etched to have a repeated pattern, such as a grid pattern, with parallel lines $18_1$ perpendicular to parallel lines $18_2$. Silicon substrate 10 is exposed through the openings 20 (refer to FIG. 2B) between the parallel lines $18_1$ and $18_2$. In an embodiment, parallel lines $18_1$ and $18_2$ are equally spaced, and hence the exposed top surface of silicon substrate 10 is divided into rectangles, and more preferably squares. The width W1 of the spacings 20 between the lines $18_1$ (or between lines $18_2$) of mask 18 is preferably less than about 100 μm, and more preferably between about 0.02 μm and about 10 μm. It is realized, however, that the dimensions recited throughout the description are merely examples, and different dimensions may also be used. The width W2 of parallel lines $18_1$ and/or $18_2$ are preferably as small as possible, for example, equal to the minimum dimension allowable in the technology used for forming the structures of the present invention. In an exemplary embodiment, width W2 is less than about 100 μm. The mask 18 with the periodical pattern advantageously defines the boundaries of the subsequently formed silicon pyramids 24, and hence the sizes and the pattern densities of the silicon pyramids 24 are more uniform.

Figure 12A:
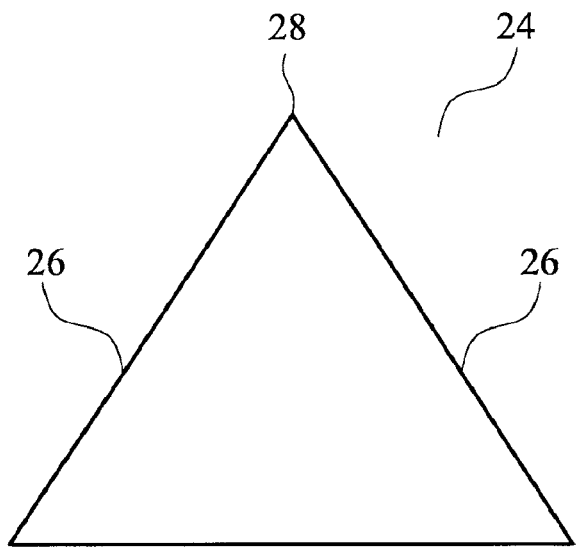
FIGS. 12A and 12B illustrate two faceted structures.
Figure 12B:
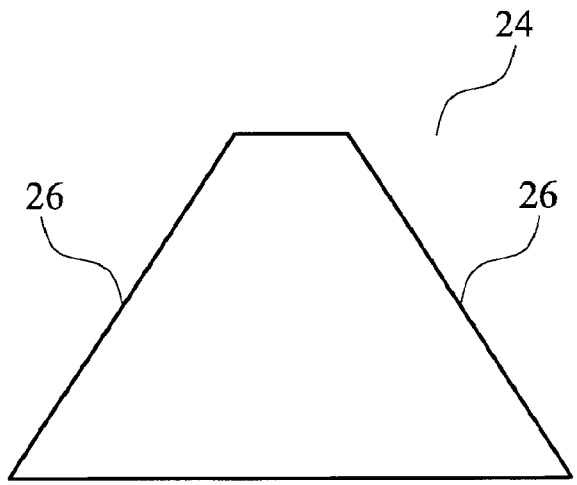

In FIG. 3A, silicon regions 24 are formed. Silicon regions 24 may be formed of silicon carbon (SiC), silicon germanium (SiGe), or substantially pure silicon. Preferably, silicon regions 24 are formed by selective epitaxial growth, and hence are confined in openings 20. Preferably, no silicon regions 24 are formed on isolation region 12. In each square or rectangular spacing between the parallel lines of mask 18, one, and preferably only one, of the silicon regions 24 are formed. Naturally, facets (which are the slopes of the silicon regions 24) 26 are formed. Process conditions are preferably adjusted to enhance the formation of facets 26. For example, the temperature for forming silicon regions 24 may be higher than about 600° C., and more preferably higher than about 700° C., so that the facets' effect is enhanced. As a result, each of the silicon regions 24 may have a pyramid shape, whose base has four sides, each being parallel to the respective nearest parallel line $18_1$ or line $18_2$. The four sides of each of the silicon regions 24 become increasingly narrower from bottom to up. Accordingly, silicon regions 24 are referred to as silicon pyramids 24 throughout the description. FIGS. 12A and 12B illustrate cross-sectional views of two of the silicon pyramids 24. In FIG. 12A, silicon pyramids 24 have a substantially ideal pyramid shape, with the slopes 26 (also referred to as facets 26 hereinafter) narrowed and meeting at a top point. In FIG. 12B, the cross-sectional view of silicon pyramids 24 are trapezoid in shape, wherein the top surfaces of the silicon pyramids 24 may be substantially flat. Throughout the description, both the silicon pyramids 24 shown in FIGS. 12A and 12B are also referred to as faceted structures 24. The base of silicon pyramids 24 may have a square or a rectangular shape. Alternatively, silicon pyramids 24 may have top regions (tips) 28 with less-than-ideal pyramid shapes. The top surface of mask 18 is preferably lower than the tips of silicon pyramids 24.

Figure 3B:
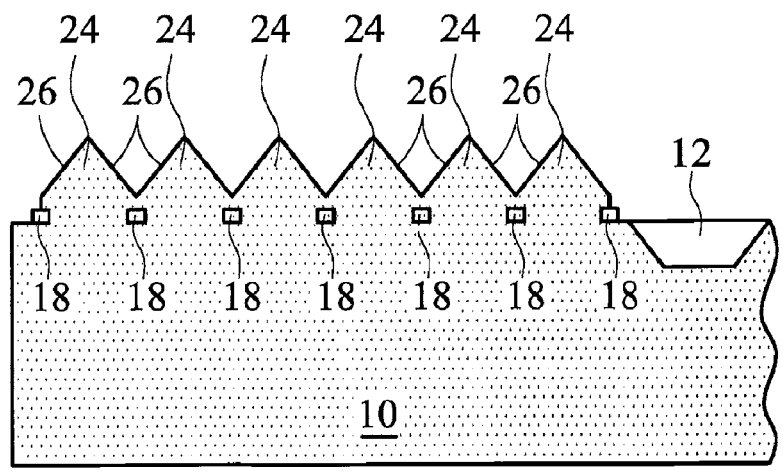

The slopes 26 of silicon pyramids 24 have (111) surface orientations, which are suitable for growing a GaN layer thereon. Accordingly, it is preferred that the areas of slopes 26 are maximized, and the exposed silicon surfaces having other surface orientations, such as (100) or (110), are minimized. Advantageously, the total area of all slopes 26 of a silicon pyramid 24 is increased over the area of the base of the silicon pyramid 24 by a factor of about 1.73. Alternatively, silicon pyramids 24, after touching mask 18, grow upward and laterally and eventually join each other, as is shown in FIG. 3B. The top regions 28 of silicon pyramids 24 also preferably have an ideal pyramid shape, so that the area of other surface orientations other than (111) is minimized.

Figure 4:
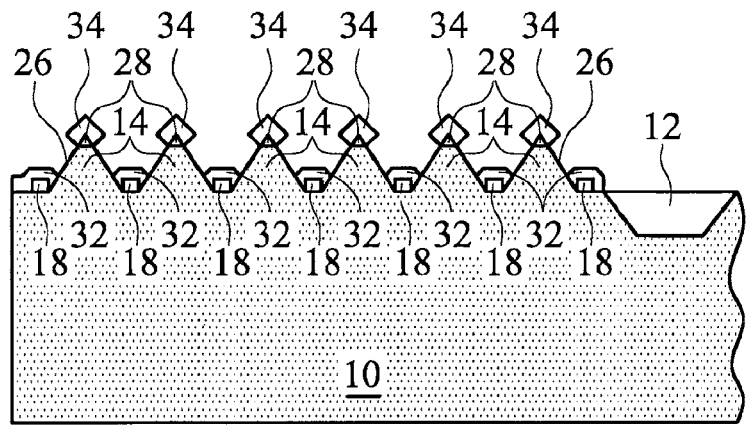

Optionally, as shown in FIG. 4, masks 32 and/or 34 are formed, with masks 32 covering mask 18, and masks 34 covering top regions 28 of silicon pyramids 24. In an embodiment, masks 32 and 34 are formed simultaneously by blanket forming a mask layer, and patterning the mask layer. Masks 32 and 34 may be formed of oxides or nitrides such as silicon oxide, silicon nitride, aluminum oxide, or the like. Masks 32 preferably extend beyond the underlying portion of mask 18 to cover the exposed top surface of silicon substrate 10, if any. If viewed from top, masks 32 may be connected to each other, and form a grid pattern similar to that of mask 18. Masks 34 cover the top regions 28 of silicon pyramids 24, and are disconnected from each other. Since the surfaces of the top regions 28 may not have the (111) surface orientation, it is advantageous to cover these portions, so that only surfaces having (111) surface orientations are exposed. In an alternative embodiment, either masks 32 or masks 34, but not both, are formed. In yet other embodiments, masks 32 are not formed in all of the openings 20. Rather, only some of the openings 20, for example, alternating openings 20, have masks 32 formed therein. In this case, mask 32 may also extend on bottom portions of slopes 26.

Figure 5:
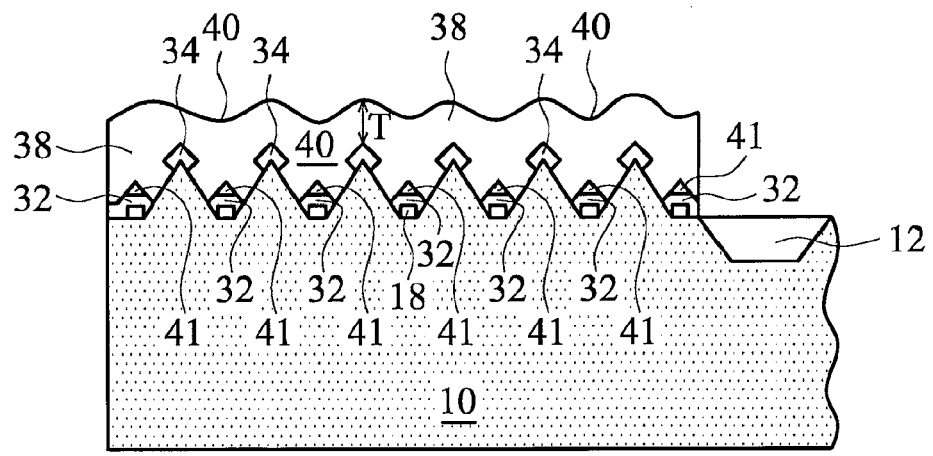

FIG. 5 illustrates the formation of group-III nitride layer 38, which preferably has a crystalline structure. As the name suggests, group-III nitride layer 38 comprises a group III element and nitride. In the preferred embodiment, group-III nitride layer 38 comprises gallium nitride (GaN), and hence is referred to as GaN layer 38 throughout the description, although other materials can also be used. In other embodiments, other group-III nitride materials, such as $In_xGa_{(1-x)}N$, $Al_xIn_yGa_{(1-x-y)}N$, and the like, or the combinations of the above discussed materials, may also be used. It is realized that the growth of GaN layer 38 includes a vertical growth and a lateral growth. As a result, the portions of GaN layer 38 grown from different silicon pyramids 24 grow upward and laterally and eventually join each other to form a continuous GaN layer 38, which extends over multiple silicon pyramids 24. The top surface of the resulting GaN layer 38 will be topographical, with some points higher than others, and has a repeated pattern. No GaN layer 38 is formed on isolation region 12. An exemplary thickness T of GaN layer 38 is between about 1 μm and about 10 μm. In an embodiment, the lowest points 40 of GaN layer 38 may be, or may not be, higher than the tips of silicon pyramids 24.

Preferably, air pockets (also referred to as air bubbles) 41 are formed between mask 18 (or masks 32 if they are formed) and the overlying GaN layer 38. Process conditions may be adjusted to increase the sizes of air pockets 41. The formation of masks 32 and the extension of masks 32 on the bottom portions of slopes 26 also help the formation and expansion of air pockets 41. Air pockets 41 are desirable features since they help release the internal stress in the resulting semiconductor chip, particularly the stresses caused by the subsequent formation of multiple layers.

Figure 6:
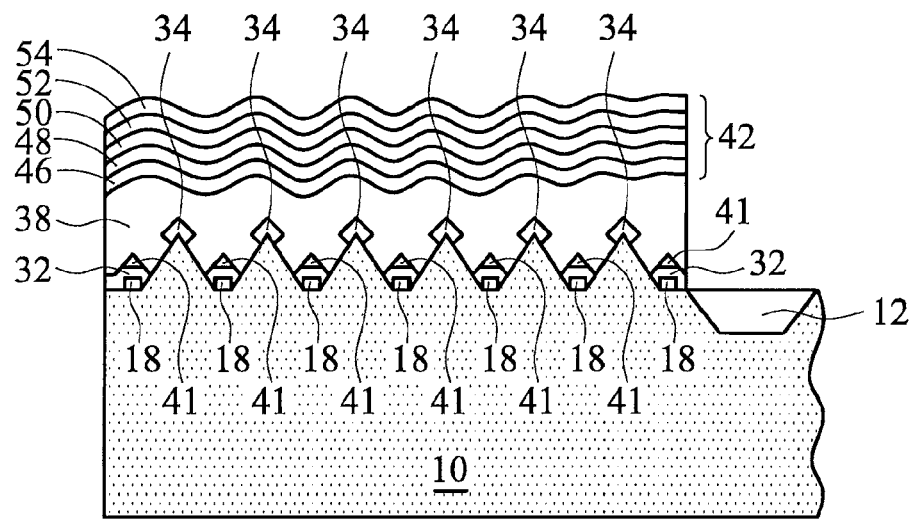

The structure shown in FIG. 5 provides a group-III nitride film for forming devices thereon, wherein the devices may be electronic and/or optoelectronic devices, such as light-emitting diodes (LED), laser diodes, ultra-violet (UV) photodetectors, and the like. FIG. 6 illustrates LED 42, which shows an exemplary version among many designs of LEDs. In an embodiment, LED 42 includes (optional) distributed bragg reflector (DBR) 46, n-GaN (GaN doped with an n-type impurity) 48, multiple quantum well (MQW) 50, p-GaN (GaN doped with a p-type impurity) 52, and top electrode 54. In an exemplary embodiment, DBR 46 is formed of AlInN/GaN or AlGaN/GaN. A buffer layer (not shown) formed of, for example, TiN, ZnO, AlN, or combinations thereof, may be inserted between layers 38 and 46. MQW 50 may be formed of, for example, InGaN, and acts as an active layer for emitting light. The formations of layers 46, 48, 50, 52 and 54 are known in the art, and hence are not repeated herein.

Advantageously, due to the non-planar surface of GaN layer 38, the overlying layers are also non-planar. Accordingly, the total area of MQW 50 is advantageously increased (as compared to a planar MQW occupying the same chip area), resulting in the improvement in light emitting efficiency. In alternative embodiments, GaN layer 38 may be planarized before the overlying layers are formed, as is similarly shown in FIG. 8.

Figure 7:
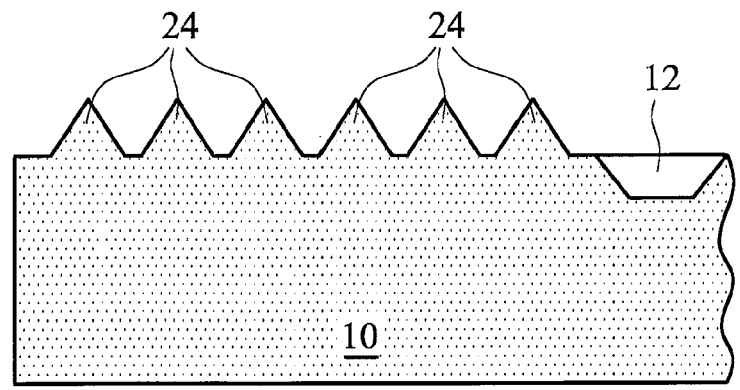
Figure 8:
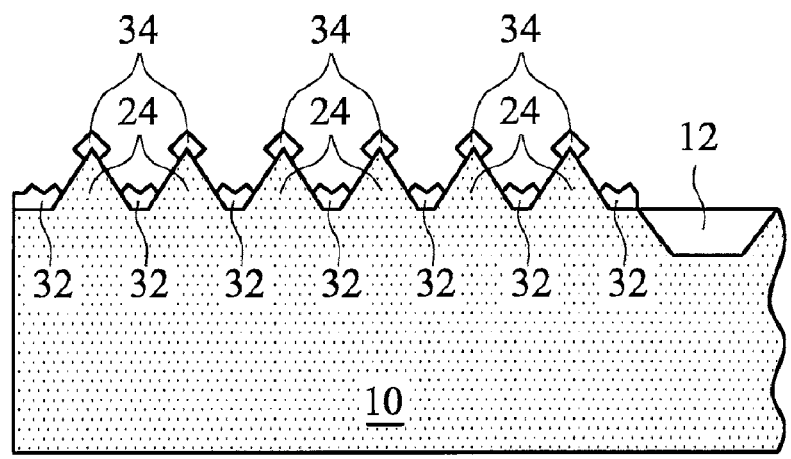
Figure 9:
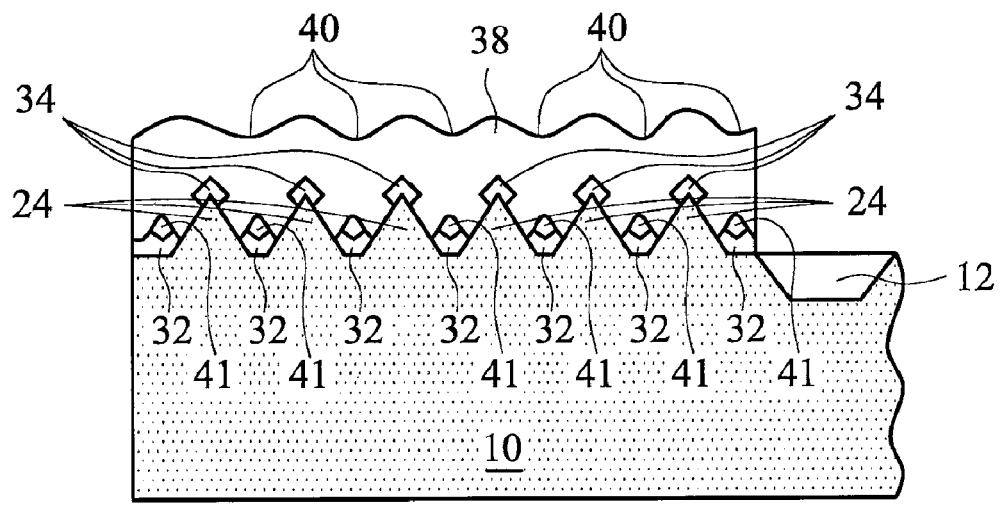
Figure 10:
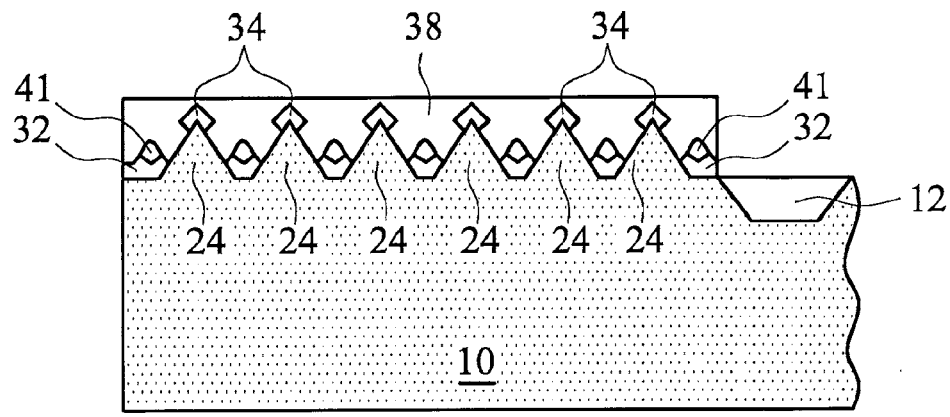
Figure 11:
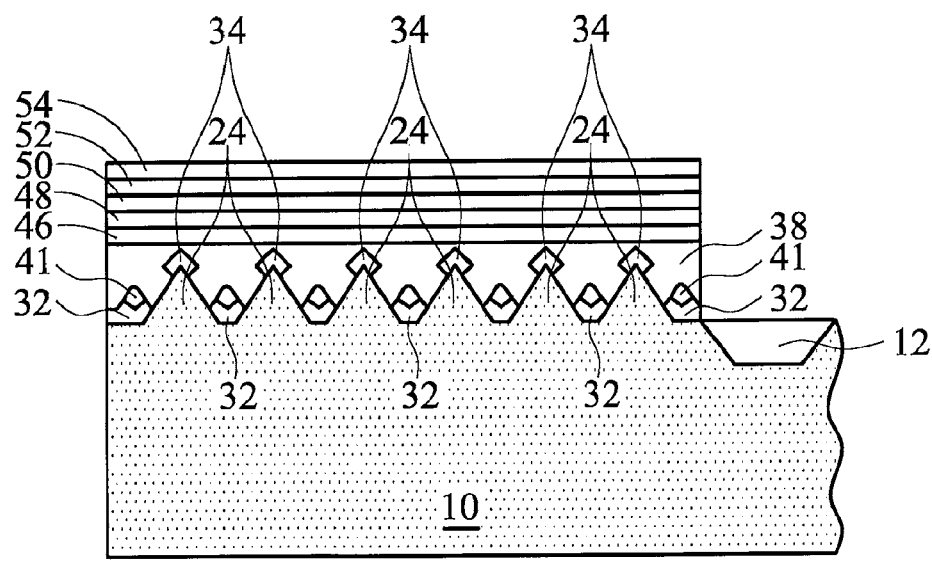

FIGS. 7 through 11 illustrate another embodiment of the present invention. The initial steps of this embodiment are essentially the same as shown in FIGS. 1A through 3. Next, as shown in FIG. 7, mask 18 is removed. Referring to FIG. 8, masks 32 and/or masks 34, which are essentially the same as shown in FIG. 4, are formed. FIG. 9 illustrates the formation of GaN layer 38. Preferably, the lowest points 40 of GaN layer 38 are higher than the tips of silicon pyramids 24. FIG. 10 illustrates an embodiment in which a planarization, for example, a chemical mechanical polish (CMP), is performed to level the top surface of GaN layer 38. Alternatively, the top surface of GaN layer 38 is not planarized, as is similarly shown in FIG. 5. Next, as shown in FIG. 11, LED 42 is formed.

The embodiments of the present invention have several advantageous features. The commonly used silicon (100) substrate can be used for the formation of GaN layer, without incurring the lattice mismatch problem. The silicon (111) formed on the silicon (100) substrate has a trigonal symmetry, and the resulting GaN layer has an improved crystalline structure. In addition, wafer bowing problems will decrease due to the use of silicon (100) substrates.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a silicon substrate;
   epitaxially growing silicon faceted structures on a top surface of the silicon substrate; and
   forming a group-III nitride layer over the silicon faceted structures, wherein the group-III nitride layer contacts slopes of the silicon faceted structures.

2. The method of claim 1, wherein the silicon faceted structures are separated from each other, and have a repeated pattern.

3. The method of claim 1, wherein the step of epitaxially growing the silicon faceted structures comprises forming a mask having a grid pattern, wherein the silicon faceted structures are formed on exposed portions of the top surface of the silicon substrate through the mask.

4. The method of claim 3 further comprising removing the mask before the step of forming the group-III nitride layer.

5. The method of claim 3, wherein the group-III nitride layer is formed over the mask.

6. The method of claim 1 further comprising, before the step of forming the group-III nitride layer, forming additional masks separated from each other, wherein the additional masks comprise portions selected from the group consisting essentially of first portions on top portions of the silicon faceted structures, second portions between the silicon faceted structures, and combinations thereof.

7. The method of claim 1 further comprising forming an additional layer over the group-III nitride layer, wherein the additional layer and the group-III nitride layer comprise different materials.

8. The method of claim 7, wherein after the step of forming the additional layer, the group-III nitride layer has a non-planar top surface.

9. The method of claim 1 further comprising performing a planarization to level a top surface of the group-III nitride layer.

10. The method of claim 1 further comprising forming a light-emitting diode on the group-III nitride layer.

11. The method of claim 1, wherein the silicon substrate is a silicon (100) substrate, the group-III nitride layer is a gallium nitride layer, and wherein the slopes of the silicon faceted structures have (111) surface orientations.

12. A method of forming a semiconductor device, the method comprising:
providing a silicon (100) substrate;
forming a mask having a grid pattern, wherein portions of a top surface of the silicon (100) substrate are exposed through the mask to form an array;
epitaxially growing silicon faceted structures on the top surface of the silicon (100) substrate, wherein slopes of the silicon faceted structures have (111) surface orientations; and
growing a gallium nitride layer over the silicon faceted structures, wherein the gallium nitride layer contacts the slopes of the silicon faceted structures.

13. The method of claim 12, wherein the gallium nitride layer has a crystalline structure.

14. The method of claim 12, wherein the mask comprises silicon oxide.

15. The method of claim 12 further comprising forming additional masks between, and adjoining, gallium nitride layer and top portions of the silicon faceted structures, wherein each of the additional masks is separated from others of the additional masks.

16. The method of claim 12 further comprising forming additional masks between the silicon (100) substrate and the gallium nitride layer, wherein the additional masks are between, and close to bases of, the silicon faceted structures.

17. The method of claim 12 further comprising forming an additional layer over the gallium nitride layer, wherein the additional layer and the gallium nitride layer are formed of different materials.

18. The method of claim 12 further comprising performing a planarization to level a top surface of the gallium nitride layer.

19. The method of claim 12 further comprising forming a light-emitting diode on the gallium nitride layer.

20. The method of claim 19, wherein an active layer of the light-emitting diode is non-planar.

* * * * *